(12) United States Patent
Aritome

(10) Patent No.: US 7,898,861 B2
(45) Date of Patent: *Mar. 1, 2011

(54) REDUCING EFFECTS OF PROGRAM DISTURB IN A MEMORY DEVICE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

This patent is subject to a terminal disclaimer.

(21) Appl. No.: 12/257,732

(22) Filed: Oct. 24, 2008

(65) Prior Publication Data

US 2009/0046507 A1 Feb. 19, 2009

Related U.S. Application Data

(63) Continuation of application No. 11/508,103, filed on Aug. 22, 2006, now Pat. No. 7,471,565.

(51) Int. Cl.
*G11C 16/04* (2006.01)

(52) U.S. Cl. .............................. 365/185.17; 365/185.18

(58) Field of Classification Search ............ 365/185.17, 365/185.18, 185.19
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,424,993 A | 6/1995 | Lee et al. | |
| 5,511,022 A | 4/1996 | Yim et al. | |
| 5,528,547 A | 6/1996 | Aritome et al. | |
| 5,621,684 A | 4/1997 | Jung | |
| 5,677,873 A | 10/1997 | Choi et al. | |
| 5,677,875 A | 10/1997 | Yamagata | |
| 5,680,350 A | 10/1997 | Lee | |
| 5,715,194 A | 2/1998 | Hu | |
| 5,768,287 A | 6/1998 | Norman et al. | |
| 5,771,346 A | 6/1998 | Norman et al. | |
| 5,907,855 A | 5/1999 | Norman | |
| 5,917,757 A | 6/1999 | Lee et al. | |
| 5,920,501 A | 7/1999 | Norman | |
| 5,930,168 A | 7/1999 | Roohparvar | |
| 5,959,892 A | 9/1999 | Lin | |
| 5,991,202 A | 11/1999 | Derhacobian | |
| 6,061,270 A | 5/2000 | Choi | |

(Continued)

OTHER PUBLICATIONS

T. Jung et al., "A 117-mm2 3.3-V Only 128-Mb Multilevel NAND Flash Memory for Mass Storage Applications" IEEE Journal of Solid-State Circuits, IEEE Inc., New York, NY, U.S., vol. 31, No. 11, Nov. 1996, pp. 1575-1583.

(Continued)

*Primary Examiner*—Vu A Le
(74) *Attorney, Agent, or Firm*—Leffert Jay & Polglaze, P.A.

(57) ABSTRACT

A method for programming that biases a selected word line with a programming voltage. An unselected word line on the source side and an unselected word line on the drain side of the selected word line are biased at a pass voltage that is less than the normal pass voltage. These unselected word lines are both located a predetermined distance from the selected word line. The remaining word lines are biased at the normal pass voltage.

15 Claims, 9 Drawing Sheets

U.S. PATENT DOCUMENTS

| | | | |
|---|---|---|---|
| 6,107,658 A | 8/2000 | Itoh et al. | |
| 6,157,575 A | 12/2000 | Choi | |
| 6,163,048 A | 12/2000 | Hirose et al. | |
| 6,240,016 B1 | 5/2001 | Haddad | |
| 6,240,023 B1 | 5/2001 | Roohparvar | |
| 6,370,062 B2 | 4/2002 | Choi | |
| 6,380,033 B1 | 4/2002 | He et al. | |
| 6,469,933 B2 | 10/2002 | Choi | |
| 6,487,117 B1 | 11/2002 | Choi et al. | |
| 6,493,270 B2 | 12/2002 | Chevallier | |
| 6,498,752 B1 | 12/2002 | Hsu et al. | |
| 6,519,181 B2 | 2/2003 | Jeong | |
| 6,522,584 B1 | 2/2003 | Chen et al. | |
| 6,620,682 B1 | 9/2003 | Lee | |
| 6,657,915 B2 | 12/2003 | Seo | |
| 6,660,585 B1 | 12/2003 | Lee et al. | |
| 6,661,707 B2 | 12/2003 | Choi et al. | |
| 6,707,714 B2 | 3/2004 | Kawamura | |
| 6,798,694 B2 | 9/2004 | Mihnea et al. | |
| 6,925,011 B2 | 8/2005 | Pekny et al. | |
| 6,975,542 B2 | 12/2005 | Roohparvar | |
| 6,977,842 B2 | 12/2005 | Nazarian | |
| 6,982,905 B2 | 1/2006 | Nguyen | |
| 7,020,017 B2 | 3/2006 | Chen et al. | |
| 7,099,193 B2 * | 8/2006 | Futatsuyama | 365/185.17 |
| 7,120,059 B2 | 10/2006 | Yeh | |
| 7,161,833 B2 | 1/2007 | Hemink | |
| 7,212,435 B2 | 5/2007 | Rudeck et | |
| 7,245,534 B2 | 7/2007 | Goda et al. | |
| 7,292,476 B2 | 11/2007 | Goda et al. | |
| 7,355,889 B2 | 4/2008 | Hemink et al. | |
| 7,394,693 B2 | 7/2008 | Aritome | |
| 7,408,810 B2 | 8/2008 | Aritome et al. | |
| 7,440,321 B2 | 10/2008 | Aritome | |
| 7,499,330 B2 | 3/2009 | Goda et al. | |
| 7,561,469 B2 | 7/2009 | Aritome | |
| 2002/0060926 A1 | 5/2002 | Choi | |
| 2002/0075727 A1 | 6/2002 | Jeong | |
| 2002/0149958 A1 | 10/2002 | Kunikiyo | |
| 2004/0080980 A1 | 4/2004 | Lee | |
| 2004/0152262 A1 | 8/2004 | Ichige et al. | |
| 2004/0237000 A1 | 11/2004 | Keays | |
| 2005/0088890 A1 | 4/2005 | Matsunaga | |
| 2005/0226055 A1 | 10/2005 | Guterman | |
| 2005/0265097 A1 | 12/2005 | Tanaka et al. | |
| 2006/0002167 A1 | 1/2006 | Rudeck et al. | |
| 2006/0023502 A1 | 2/2006 | Cernea et al. | |
| 2006/0274583 A1 | 12/2006 | Lutze | |
| 2007/0047314 A1 | 3/2007 | Goda et al. | |
| 2007/0177429 A1 | 8/2007 | Nagashima et al. | |
| 2007/0236992 A1 | 10/2007 | Oowada | |
| 2007/0258286 A1 | 11/2007 | Higashitani | |
| 2008/0101126 A1 | 5/2008 | Hemink | |
| 2008/0253187 A1 | 10/2008 | Aritome | |
| 2008/0316827 A1 | 12/2008 | Higashitani | |
| 2009/0189211 A1 | 7/2009 | Orimoto et al. | |

OTHER PUBLICATIONS

K. Suh et al., "A 3.3 V 32 Mb NAND Flash Memory with Incremental Step Pulse Programming Scheme" IEEE Journal of Solid-State Circuits, IEEE Inc., New York, NY, vol. 30, No. 11, Nov. 1995, pp. 1149-1156.

S. Satoh et al., A Novel Gate-Offset NAND Cell (GOC-NAND) Technology Suitable for High-Density and Low-Voltage-Operation Flash Memories, Microelectronics Engineering Laboratory, Japan, IEEE, 1999, 4 pgs.

S. Satoh et al., A Novel Isolation-Scaling Technology for NAND EEPROMs with the Minimized Program Disturbance, Microelectronics Engineering Laboratory, Japan, IEEE, 1997, IEDM 97-291, pp. 11.6.1-11.6.4.

* cited by examiner

REDUCING EFFECTS OF PROGRAM DISTURB IN A MEMORY DEVICE

CROSS-REFERENCE TO RELATED APPLICATION

This is a Continuation Application of U.S. patent application Ser. No. 11/508,103, titled "REDUCING EFFECTS OF PROGRAM DISTURB IN A MEMORY DEVICE," filed Aug. 22, 2006 now U.S. Pat. No. 7,471,565, (allowed), which is assigned to the assignee of the present invention and the entire contents of which are incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. Generally, these can be considered either volatile or non-volatile memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

In the NOR array architecture, the floating gate memory cells of the memory array are arranged in a matrix. The gates of each floating gate memory cell of the array matrix are connected by rows to word select lines (word lines) and their drains are connected to column bitlines. The source of each floating gate memory cell is typically connected to a common source line. The NOR architecture floating gate memory array is accessed by a row decoder activating a row of floating gate memory cells by selecting the wordline connected to their gates. The row of selected memory cells then place their stored data values on the column bitlines by flowing a differing current if in a programmed state or not programmed state from the connected source line to the connected column bitlines.

FIG. 1 shows a portion of a typical prior art NAND flash memory array. The selected word line 100 for the flash memory cells being programmed is typically biased by programming pulses that start at a voltage of around 16V and may incrementally increase to more than 20V. The selected word line 100 of the cells 101-103 to be programmed is biased at 19V. The unselected word lines for the remaining cells are biased at $V_{pass}$. This is typically in an approximate range of 9-10V. The bit lines of the cells 101-103 to be programmed are biased at 0V while the inhibited bit lines are biased at $V_{CC}$.

As NAND flash memory is scaled, parasitic capacitance coupling between the selected word line and adjacent word lines becomes problematic. Because of the parasitic coupling, the neighboring cells are more prone to program disturb than the other cells that also share the common bit line with the cells being programmed. This causes the cells on neighboring wordlines to experience program disturb.

The program disturb condition has two operational types: boosting and $V_{pass}$. During boosting, the cell's channel is at a positive boosting voltage (e.g., 6V) with respect to the gate and the gate is at $V_{pgm}$ (e.g., 19V). During $V_{pass}$, the cell's channel is at ground and the gate is at $V_{pass}$ (e.g., 10V). In FIG. 1, the cells 120, 121 on the selected word line 100 and inhibited bit lines are influenced by boosting program disturb. The neighboring cells 110-118 that are coupled to the enabled bit lines experience $V_{pass}$ program disturb.

FIG. 2 illustrates a cross-sectional view of a column of memory cells and the capacitive coupling resulting from a typical prior art programming operation. Each cell 200 is comprised of a floating gate 212 surrounded on either side by a tunnel dielectric 213 and a gate dielectric 211 that isolates the floating gate from the substrate 220 and the control gate 210, respectively. The column of cells is linked by source/drain regions 215, 216 that are formed in the substrate 220 between each cell stack 200.

During a typical prior art programming operation, the word line ($WL_n$) of the cell to be programmed 200 is biased at $V_{pgm}$. The word lines of the unselected cells are biased at $V_{pass}$. The program disturb of cells coupled to $WL_{n-1}$ and $WL_{n+1}$ is going to be worse than other word lines due to the word line capacitive coupling 201 and the floating gate capacitive coupling 202. The potential of the floating gates of the unselected cells on $WL_{n-1}$ and $WL_{n+1}$ will be higher than other unselected cells due to this proximity. Additionally, word line-to-word line break down or leakage can be a problem, especially between the selected word line and the unselected, adjacent word lines.

If $V_{pass}$ on $WL_{n-1}$ and $WL_{n-1}$ is reduced to prevent word line-to-word line breakdown issues, coupling disturb issues increase. If $V_{pass}$ in adjacent word lines to $V_{pgm}$ is decreased to prevent coupling disturb issues, the word line-to-word line breakdown issues increase.

For the reasons stated above, and for other reasons stated below which will become apparent to those skilled in the art upon reading and understanding the present specification, there is a need in the art for a way to address the effects of program disturb in a memory device.

DETAILED DESCRIPTION

Figure 1:
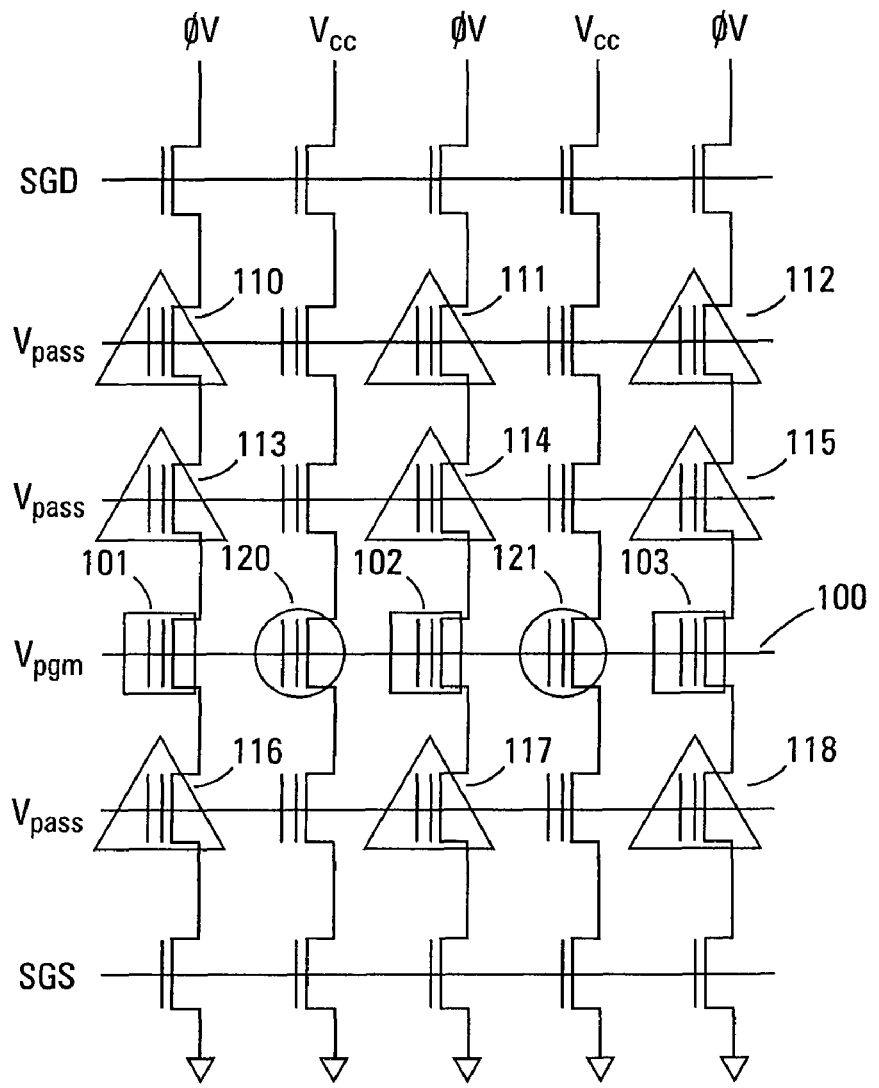
FIG. 1 shows a typical prior art NAND architecture memory array with word line biasing.
Figure 2:
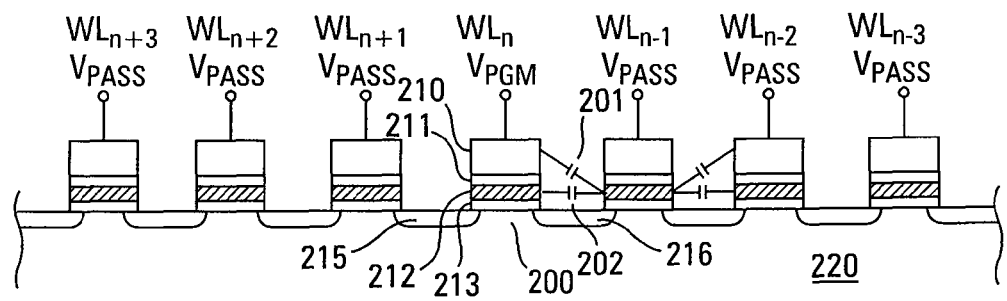
FIG. 2 shows a cross-sectional view of a column of memory cells during a typical prior art program operation and the resulting capacitive coupling.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
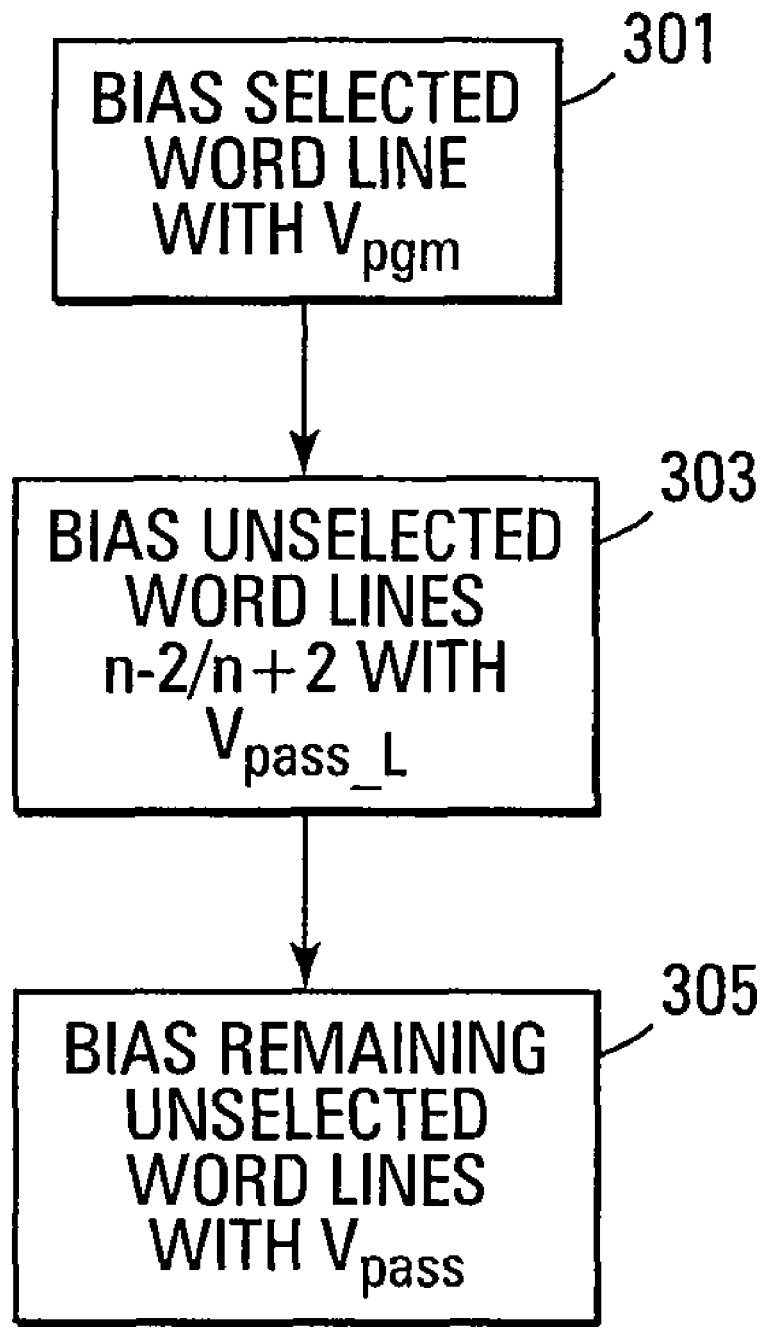
FIG. 3 shows a flow chart of one embodiment of a programming method.

FIG. 3 illustrates a flowchart of one embodiment of a method for reducing the effects of program disturb in a single level cell (SLC). An SLC is a memory cell that stores one bit of data as either a logic one or zero, while a multi-level cell (MLC) stores multiple bits. The method is comprised of biasing a selected word line with a $V_{pgm}$ voltage 301. In one embodiment, $V_{pgm}$ is a series of pulses in a range of approximately 15V to 21V. Alternate embodiments can use other voltages.

Unselected word lines that are two away from, and on either side of (i.e., $WL_{n-2}/WL_{n+2}$), the selected word line (i.e., $WL_n$), are biased with $V_{pass\_L}$ 303. In one embodiment, $V_{read} \leq V_{pass\_L} < V_{pass}$. $V_{pass\_L}$ is greater than or equal to the read voltage $V_{read}$ in order to prevent gate induced drain leakage (GIDL).

As is well known in the art, $V_{read}$ is the read voltage that is used to bias a selected word line in order to read the data stored in a particular cell or cells on the word line. In one embodiment, $V_{read}$ is approximately 0V for SLC and in a range of 0 v-2.5V for MLC. Alternate embodiments can use other read voltages. The bit line biasing is used to select the particular cell or cells to be coupled to the sense amplifiers for reading.

The remaining unselected word lines are biased with the normal $V_{pass}$ voltage 305. In one embodiment, normal $V_{pass}$ is approximately in the range of 8-10V. Alternate embodiments, however, can use other pass voltages.

In an alternate embodiment, $WL_{n+2}$ can be a different voltage that is less than $V_{pass\_L}$ that biases $WL_{n-2}$. This is due to the fact that the memory cells coupled to $WL_{n+2}$ are in an erased state prior to being programmed and gate induced drain leakage will not occur if a voltage lower than $V_{pass\_L}$ is used.

Figure 4:
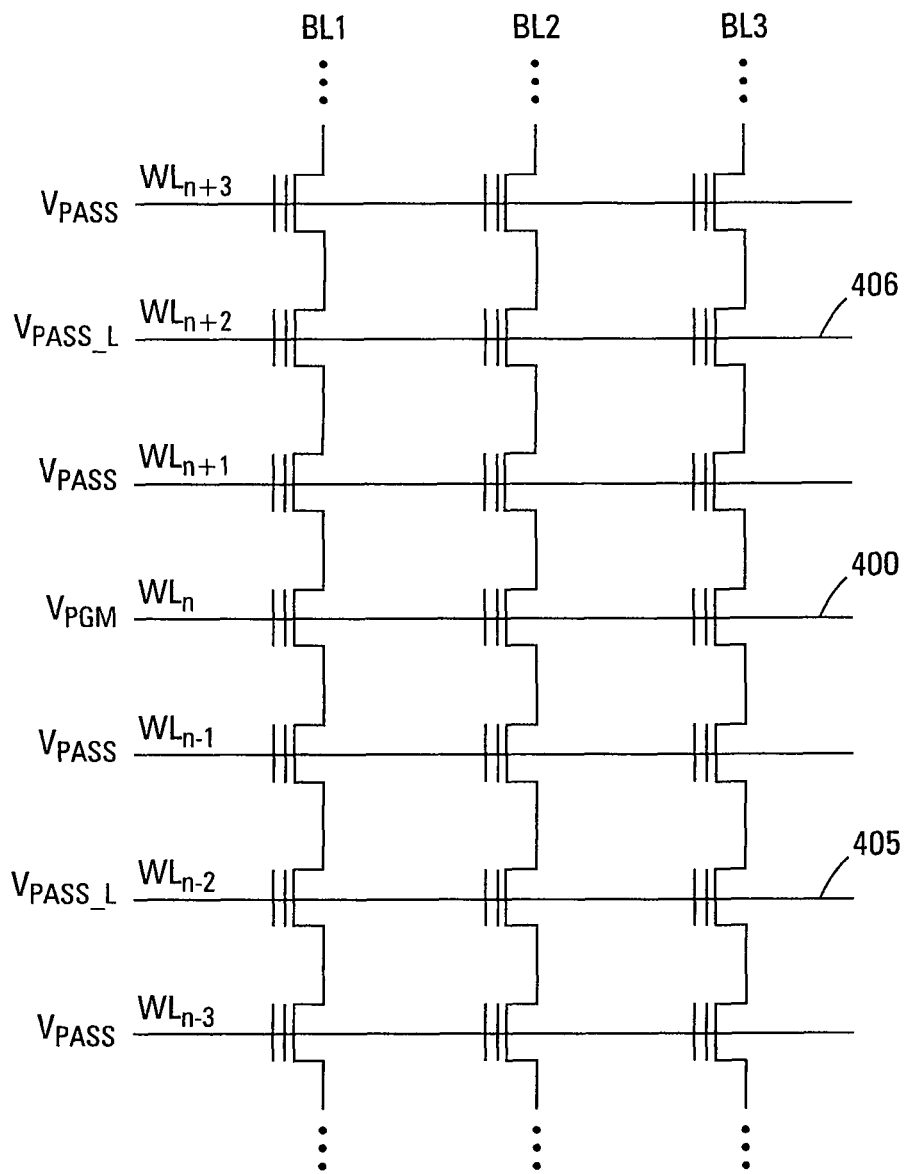
FIG. 4 shows a memory array with the word line biasing of a programming method.

FIG. 4 illustrates application of the programming embodiment of FIG. 3 to a memory array. In one embodiment, the memory array is a NAND flash memory array comprised of an array of non-volatile, single level memory cells.

Word line $WL_n$ 400 is the selected word line and is coupled to memory cell or cells to be programmed. This word line 400 is biased at $V_{pgm}$.

Word lines $WL_{n-2}$ 405 and $WL_{n+2}$ 406 are word lines that are two away from $WL_n$ 400 and on both the source and drain sides of $WL_n$ 400. Word lines $WL_{n-2}$ 405 and $WL_{n+2}$ 406 are biased at the $V_{pass\_L}$ voltage. The remaining unselected word lines are biased at $V_{pass}$.

If the bottom two word lines (i.e., WL0 and WL1) of the array are to be programmed, there are no $WL_{n-2}$ word lines to be biased at $V_{pass\_L}$. In both cases only unselected word line $WL_{n+2}$ is biased at $V_{pass\_L}$ and the remaining word lines are biased at $V_{pass}$. When programming reaches WL2, $WL_{n-2}$ and $WL_{n+2}$ are biased as illustrated previously.

Bit lines BL1-BL3 are biased as necessary to enable or inhibit the programming operation. In one embodiment, the bit lines to be inhibited are biased at $V_{CC}$ and the bit lines that are coupled to cells to be programmed are biased at 0V. Alternate embodiments may use other voltages.

Figure 6:
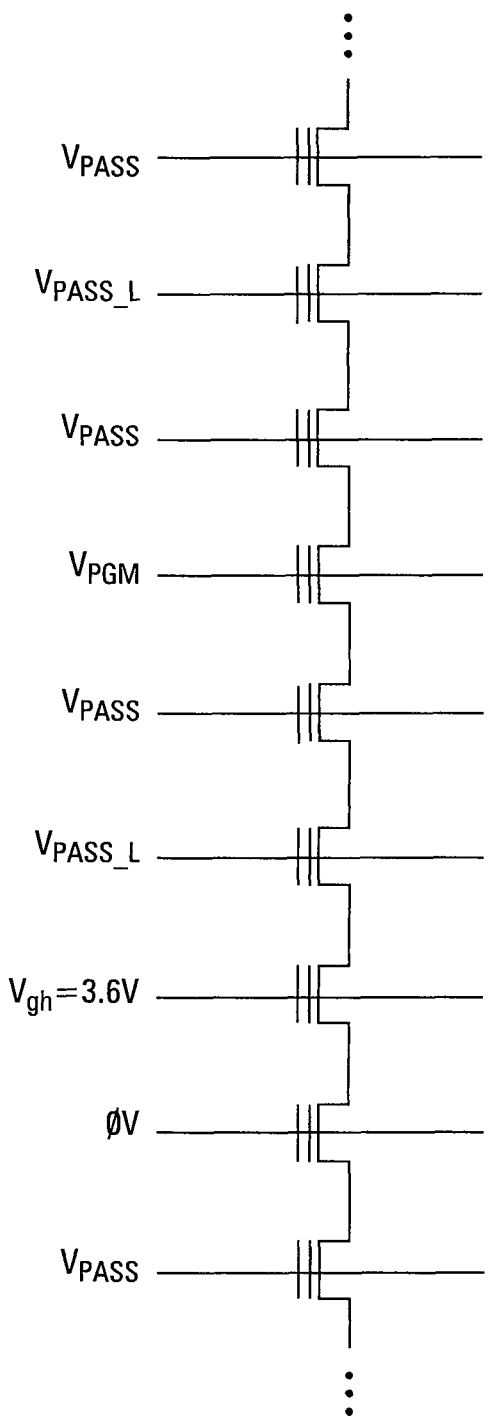
FIG. 6 shows a memory array of multilevel memory cells incorporating one embodiment of a programming method.
Figure 7:
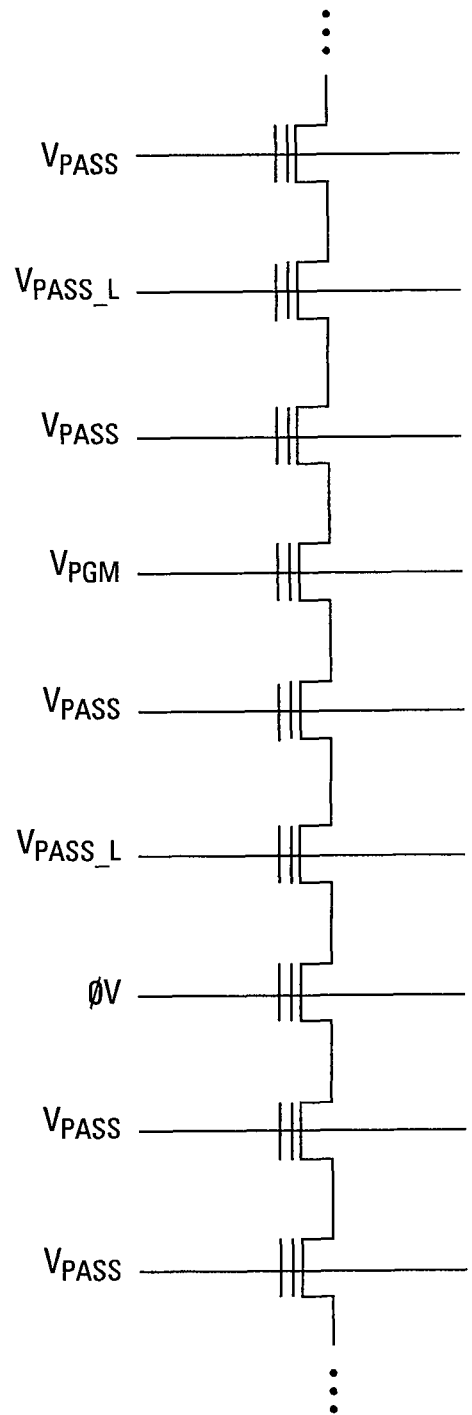
FIG. 7 shows a memory array of multilevel memory cells incorporating an alternate embodiment of a programming method.

The embodiments of FIGS. 3 and 4 illustrate programming to reduce the effects of program disturb in a single level cell. Embodiments for reducing the effects of program disturb in a multilevel cell (MLC) device are substantially similar to that illustrated in FIGS. 3 and 4. However, the biasing of certain source side word lines is different, as illustrated in FIGS. 6 and 7 and described subsequently in greater detail.

As is well known in the art, a non-volatile memory cell is programmed by a series of incrementally increasing voltage pulses (i.e., $V_{pgm}$) on the selected word line. The pulses typically start at an initial voltage (e.g., 16V) and increase by some step voltage (e.g., 0.8V) until the desired cells are either programmed or an error occurs due to the cell or cells not being programmable.

Figure 5:
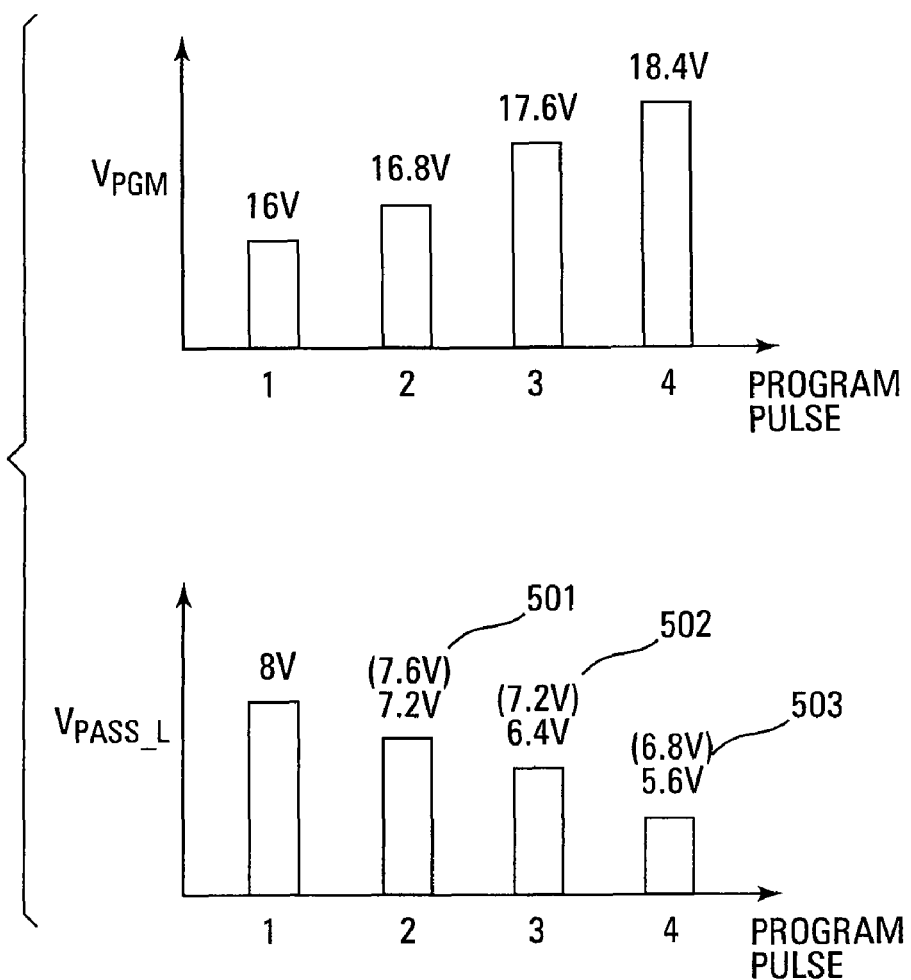
FIG. 5 shows plots of $V_{pgm}$ for each programming pulse with its corresponding $V_{pass\_L}$ in accordance with a programming method.

FIG. 5 illustrates one embodiment of the present invention for $V_{pgm}$ and $V_{pass\_L}$ pulses. In the illustrated embodiment, as the voltage level of the $V_{pgm}$ pulses increase, the voltage level of the $V_{pass\_L}$ pulses decrease.

FIG. 5 illustrates that $V_{pgm}$ increments by a step voltage of 0.8V for every subsequent program pulse. In one embodiment, $V_{pass\_L}$ decrements by the same step voltage of 0.8V. Thus, if $V_{pgm}$ starts at 16V for the initial programming pulse, the corresponding $V_{pass\_L}$ pulse is 8V. The second programming pulse is 16.8V and the second $V_{pass\_L}$ pulse is 7.2V. The third programming pulse is 17.6V with a corresponding $V_{pass\_L}$ pulse of 6.4V. Finally, the fourth programming pulse is 18.4V with a corresponding $V_{pass\_L}$ pulse of 5.6V.

In an alternate embodiment, the $V_{pass\_L}$ pulses are decremented by a different step voltage from the $V_{pgm}$ pulses. For example, the second, third, and fourth $V_{pass\_L}$ pulses may be decremented by 0.4V such that they are 7.6V, 7.2V, and 6.8V, respectively.

The voltages illustrated are for purposes of illustration only. There is no requirement that $V_{pgm}$ start at 16V and $V_{pass\_L}$ start at 8V. Nor is there any certain step voltage. There also is no requirement that the step voltages for either the $V_{pgm}$ pulses or the $V_{pass\_L}$ pulses are the same for each subsequent program pulse.

FIG. 6 illustrates one embodiment for a programming method for reducing the effects of program disturb in a MLC memory device. For purposes of clarity, FIG. 6 shows only one column (i.e., bit line) of the memory array. Remaining columns are biased in substantially the same manner. This type of biasing reduces the GIDL since the boosting voltage is reduced on the drain side of the bit line.

As in the previous embodiment for SLC memory devices, $WL_n$ is biased at $V_{pgm}$ and $WL_{n-2}/WL_{n+2}$ are biased at $V_{pass\_L}$. However, in this MLC embodiment, the next two unselected word lines after $WL_{n-2}$ (i.e., $WL_{n-3}$ and $WL_{n-4}$) have decreasing biasing from the $V_{pass\_L}$ voltage level. The remaining unselected word lines are biased at the normal $V_{pass}$ voltage.

In the embodiment illustrated in FIG. 6, the voltages are 3.6V for $WL_{n-3}$ and 0V for $WL_{n-4}$. Alternate embodiments can use other voltages for these drain side unselected word lines.

FIG. 7 illustrates another MLC memory device embodiment for reducing the effects of program disturb. This embodiment biases $WL_n$ with $V_{pgm}$ and $WL_{n-2}/WL_{n+2}$ with $V_{pass\_L}$ as in previous embodiments. In this embodiment, $WL_{n-3}$ is biased at 0V or some other voltage that is less than $V_{pass\_L}$. This embodiment also provides an improvement in GIDL reduction as the embodiment of FIG. 6.

Figure 8:
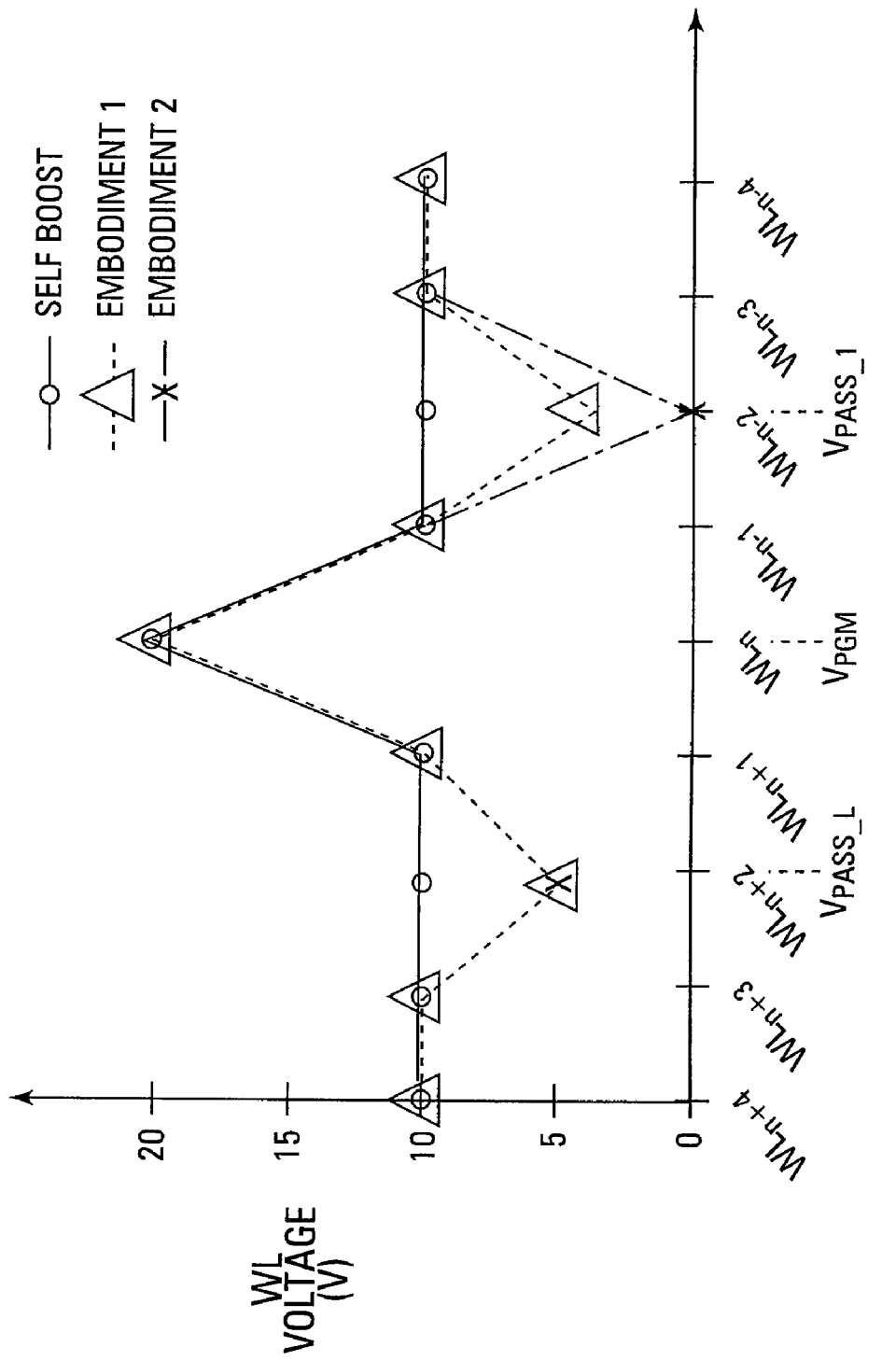
FIG. 8 shows a plot of word line voltage versus word lines in accordance with a programming method.

FIG. 8 illustrates a plot of word line voltage versus each word line number. The plot, for purposes of clarity, only shows nine word lines, $WL_n$ through $WL_{n\pm 4}$. However, such a plot can be produced for an entire 32 bit column.

FIG. 8 illustrates a plot of word line voltage versus word lines for the embodiments of the present invention. This plot shows two embodiments for biasing $WL_n$ and $WL_{n-2}/WL_{n+2}$ as well as the self-boost embodiment in which the channels of the cells on the respective word lines are left floating.

Embodiment 1 shows that both $WL_{n-2}$ and $WL_{n+2}$ are biased with the same voltage (e.g., 5V). Embodiment 2 takes advantage of the fact that the word lines on the drain side of $WL_n$ are erased. Thus, embodiment 2 can bias $WL_{n-2}$ at 0V.

Figure 11:
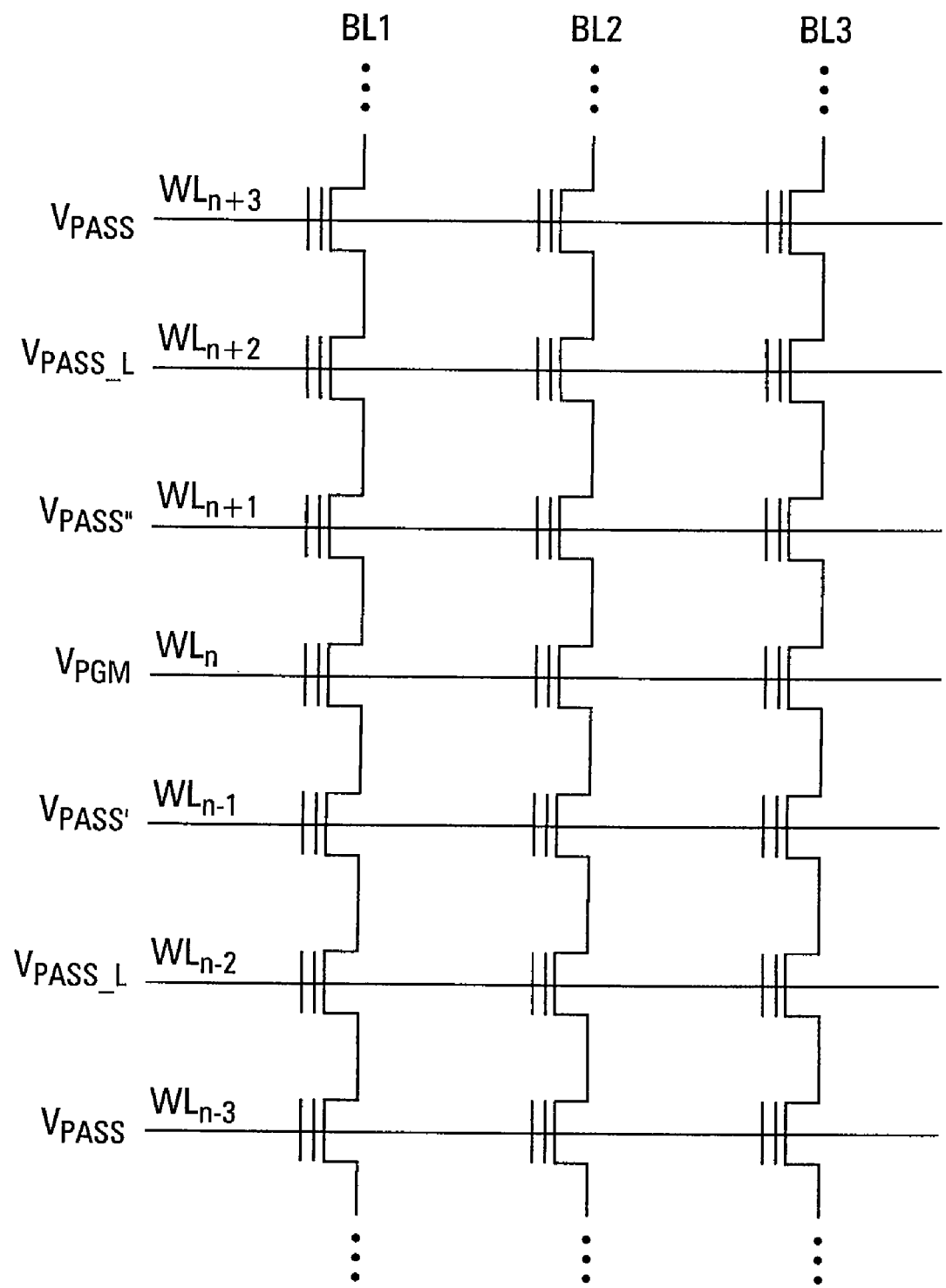
FIG. 11 shows a memory array with an alternate embodiment of word line biasing of a programming method.

FIG. 11 illustrates an alternate embodiment of word line biasing to reduce the effects of program disturb. In this embodiment, in addition to the $V_{pass\_L}$ voltages for $WL_{n-2}$ and $WL_{n+2}$ as described above, the word lines immediately on either side of the word line to be programmed $WL_n$ are also biased with different voltages $V_{pass'}$ and $V_{pass''}$ that are not equal to $V_{pass}$.

In one embodiment, $V_{pass'}=V_{pass''}$. In another embodiment, $V_{pass'}\neq V_{pass''}$. In yet another embodiment, $V_{pass'}$ and/or $V_{pass''}>V_{pass}$. In still another embodiment, $V_{pass'}$ and/or $V_{pass''}<V_{pass}$.

Figure 9:
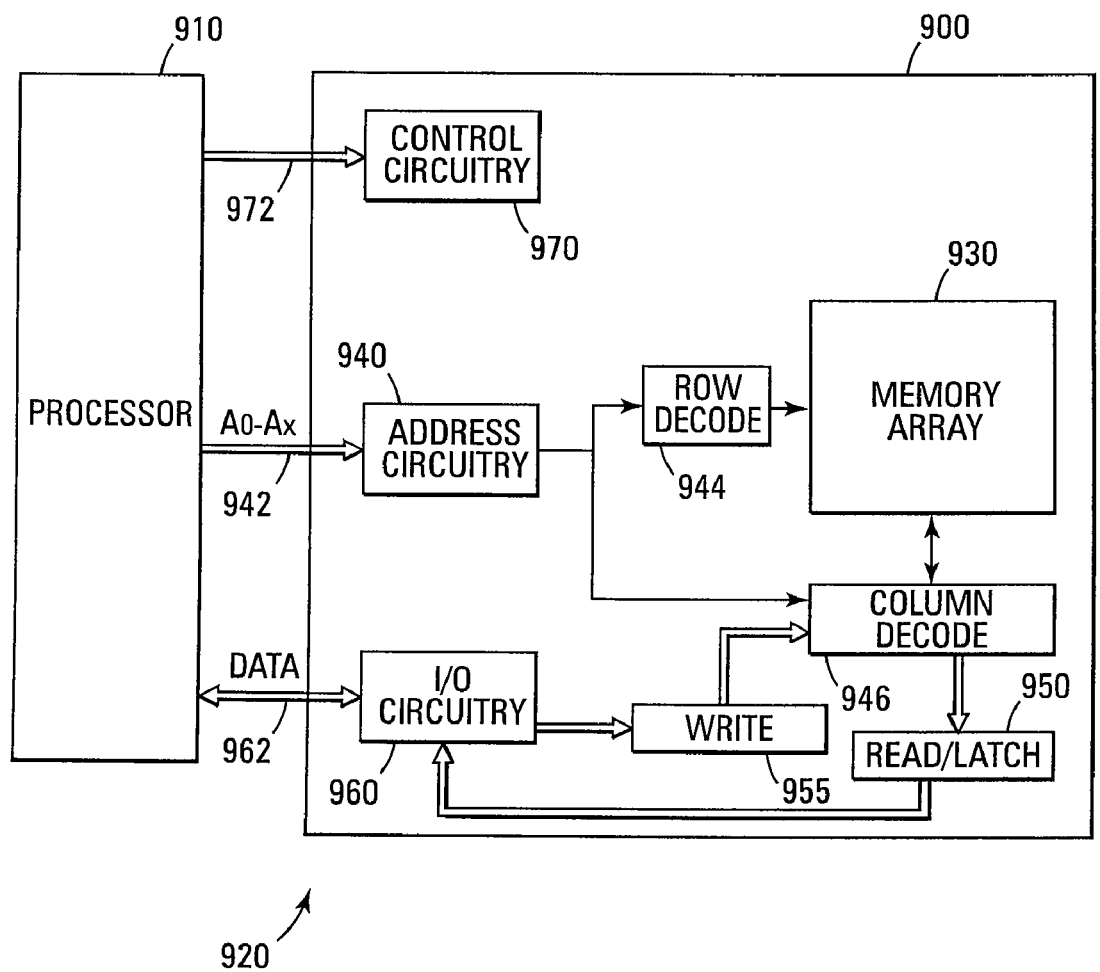
FIG. 9 shows a block diagram for one embodiment of a memory system.

FIG. 9 illustrates a functional block diagram of a memory device 900 that can incorporate memory cells of an embodiment of the present invention. The memory device 900 is coupled to a control device 910. The control device 910 may be a microprocessor, a memory controller or some other type of controlling circuitry. The memory device 900 and the processor 910 form part of an electronic system 920. The memory device 900 has been simplified to focus on features of the memory that are helpful in understanding the present invention.

The memory device includes an array of memory cells 930 that can include flash memory cells or some other type of non-volatile memory cells. The memory array 930 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture, a NOR architecture, an AND architecture, or some other array architecture.

An address buffer circuit 940 is provided to latch address signals provided on address input connections A0-Ax 942. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense amplifier/buffer circuitry 950. The sense amplifier/buffer circuitry, in one embodiment, is coupled to read and latch a row of data from the memory array 930. Data input and output buffer circuitry 960 is included for bidirectional data communication over a plurality of data connections 962 with the controller 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller. The control circuitry 970 of the present invention, in one embodiment, is responsible for executing the method of the present invention for programming the memory cells.

The memory device illustrated in FIG. 9 has been simplified to facilitate a basic understanding of the features of the memory and is for purposes of illustration only. A more detailed understanding of internal circuitry and functions of memories are known to those skilled in the art. Alternate embodiments may include a memory cell of one embodiment of the present invention in other types of electronic systems.

Figure 10:
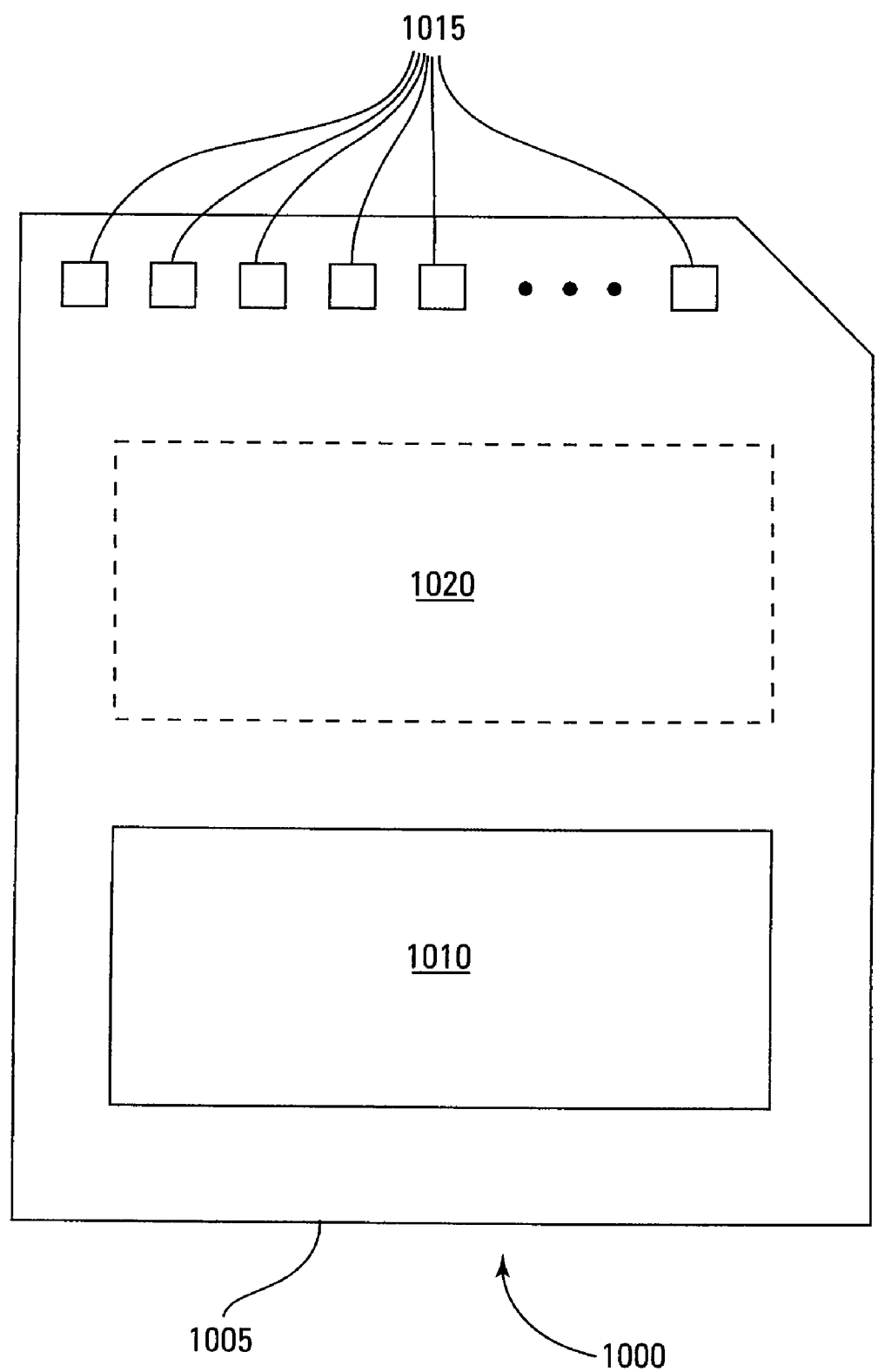
FIG. 10 shows a block diagram for one embodiment of a memory module.

FIG. 10 is an illustration of a memory module 1000 that incorporates memory cell embodiments as discussed previously. Although memory module 1000 is illustrated as a memory card, the concepts discussed with reference to memory module 1000 are applicable to other types of removable or portable memory, e.g., USB flash drives. In addition, although one example form factor is depicted in FIG. 10, these concepts are applicable to other form factors as well.

Memory module 1000 includes a housing 1005 to enclose one or more memory devices 1010 of the present invention. The housing 1005 includes one or more contacts 1015 for communication with a host device. Examples of host devices include digital cameras, digital recording and playback devices, PDAs, personal computers, memory card readers, interface hubs and the like. For some embodiment, the contacts 1015 are in the form of a standardized interface. For example, with a USB flash drive, the contacts 1015 might be in the form of a USB Type-A male connector. In general, however, contacts 1015 provide an interface for passing control, address and/or data signals between the memory module 1000 and a host having compatible receptors for the contacts 1015.

The memory module 1000 may optionally include additional circuitry 1020. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of I/O connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010. The additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

In summary, the embodiments described herein provide a way to reduce the effects of program disturb in a memory device. This is accomplished by biasing the selected word line ($WL_n$) with $V_{pgm}$. In one embodiment, an unselected drain side word lines ($WL_{n+2}$) and an unselected source side word line ($WL_{n-2}$) are biased with pass voltages of $V_{pass\_L}$ while the remaining unselected word line are biased with normal pass voltage $V_{pass}$ where $0V \leq V_{pass\_L} < V_{pass}$. In an alternate embodiment, the pass voltage that biases $WL_{n+2}$ can be less than the pass voltage that biases $WL_{n-2}$.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory array, the method comprising:
    applying a programming voltage to a selected row of memory cells;
    applying a first pass voltage to a first unselected row of memory cells, the first unselected row of memory cells located a predetermined distance, greater than one row of memory cells, from the selected row of memory cells on a drain side of the selected row of memory cells;
    applying a second pass voltage to a second unselected row of memory cells, the second unselected row of memory cells located at the predetermined distance from the selected row of memory cells on a source side of the selected row of memory cells; and
    applying a third pass voltage to all remaining unselected rows of memory cells wherein the first and second pass voltages are less than the third pass voltage.

2. The method of claim 1 wherein the first and second pass voltages are substantially equal.

3. The method of claim 1 wherein the first pass voltage for the first unselected row of memory cells is less than the second pass voltage for the second unselected row of memory cells.

4. The method of claim 1 wherein applying the programming voltage to the selected word line comprises applying a series of programming pulses that increase by a step voltage.

5. The method of claim 4 wherein applying the first and second pass voltages to the first and second unselected rows of memory cells comprises applying a series of pass voltage pulses to each row that decrease by the step voltage.

6. The method of claim 4 wherein applying the first and second pass voltages to the first and second unselected rows of memory cells comprises applying a series of pass voltage pulses that decrease.

7. The method of claim 1 wherein the programming voltage programs at least one memory cell of the selected row of memory cells as a multi-level cell.

8. A method for programming a memory device, the method comprising:
    applying a plurality of programming pulses to a selected word line $WL_n$;
    applying a first pass voltage to unselected row of memory cells $WL_{n+2}$;
    applying a second pass voltage to unselected row of memory cells $WL_{n-2}$; and
    applying a third pass voltage to all remaining unselected rows of memory cells wherein the first and second pass voltages are less than the third pass voltage and greater than or equal to a read voltage that has a magnitude large enough to read a selected memory cell.

9. The method of claim 8 wherein $WL_{n+2}$ is on a drain side of $WL_n$ within a bit line coupled to $WL_n$.

10. The method of claim 8 wherein $WL_{n-2}$ is on a source side of $WL_n$ within a bit line coupled to $WL_n$.

11. The method of claim 8 wherein the memory device is a NAND flash single level cell memory device.

12. The method of claim 8 wherein the memory device is a NAND flash multi-level cell memory device.

13. A non-volatile memory device comprising:
    a memory array comprised of a plurality of memory cells arranged in rows and columns, each row comprising a word line of memory cells and each column comprising a bit line of memory cells such that each word line of memory cells is readable in response to a read voltage; and
    a memory control circuit coupled to the memory array for controlling operations of the memory device, the control circuit configured to program the memory array in response to application of a plurality of programming pulses to a selected row of memory cells, application of a first plurality of pass voltage pulses to one unselected, nonadjacent row of memory cells on a drain side of the selected row of memory cells and one unselected, non-adjacent row of memory cells on a source side of the selected row of memory cells, and the memory control circuit further configured to apply a second plurality of pass voltage pulses to all remaining unselected word lines wherein the first plurality of pass voltage pulses start at a voltage that is less than a starting voltage of the second plurality of pass voltage pulses and greater than or equal to the read voltage.

14. The system of claim 13 wherein the plurality of memory cells are multi-level memory cells configured to store multiple bits.

15. The system of claim 13 wherein the control circuitry is further configured to control biasing of the bit lines such that bit lines not coupled to the cells to be programmed are biased at $V_{cc}$ and bit lines coupled to the memory cells to be programmed are biased at ground potential.

* * * * *

UNITED STATES PATENT AND TRADEMARK OFFICE
CERTIFICATE OF CORRECTION

| | | |
|---|---|---|
| PATENT NO. | : 7,898,861 B2 | Page 1 of 1 |
| APPLICATION NO. | : 12/257732 | |
| DATED | : March 1, 2011 | |
| INVENTOR(S) | : Seiichi Aritome | |

It is certified that error appears in the above-identified patent and that said Letters Patent is hereby corrected as shown below:

On the Title page, in field (57), under "Abstract", in column 2, line 6, after "located" insert -- at --.

In column 7, line 46, in Claim 1, after "located" insert -- at --.

Signed and Sealed this

Nineteenth Day of April, 2011

David J. Kappos
*Director of the United States Patent and Trademark Office*